United States Patent [19]
Bae

[11] Patent Number: 5,327,530
[45] Date of Patent: Jul. 5, 1994

[54] VIDEO BOARD FOR SERVING BOTH 1-BIT PLANE OPERATION AND 2-BIT PLANE OPERATION

[75] Inventor: Shee-Kyu Bae, Suwon, Rep. of Korea

[73] Assignee: SamSung Electronics Co., Ltd., Suwon, Rep. of Korea

[21] Appl. No.: 488,724

[22] Filed: Feb. 28, 1990

[30] Foreign Application Priority Data

Jul. 21, 1989 [KR] Rep. of Korea ............ 10386

[51] Int. Cl.$^5$ ............................................. G06F 15/62
[52] U.S. Cl. .................................... 395/162; 395/164; 345/155
[58] Field of Search .................. 364/518–522; 395/153, 162–166; 340/800, 801; 345/3, 5, 98, 160, 132, 133, 153–155, 189–191, 197, 198

[56] References Cited

U.S. PATENT DOCUMENTS

| | | | |
|---|---|---|---|
| 4,595,917 | 6/1986 | McCallister et al. | 364/521 X |
| 4,771,279 | 9/1988 | Hannah | 340/801 |
| 4,823,286 | 4/1989 | Lumelsky et al. | 364/518 X |
| 4,851,834 | 7/1989 | Stockebrand et al. | 340/801 |
| 4,858,107 | 8/1989 | Fedele | 364/518 X |
| 4,910,687 | 3/1990 | Butler et al. | 340/800 |
| 4,967,378 | 10/1990 | Rupel et al. | 364/518 |

Primary Examiner—Mark K. Zimmerman
Assistant Examiner—Almis Jankus
Attorney, Agent, or Firm—Robert E. Bushnell

[57] ABSTRACT

A video board in a personal computer supports a 2-gray level monitor as well as a 4-gray level monitor, by serving both the 1-bit plane video board operation and the 2-bit plane video board operation. A video output controller, having a shift register, a jumper and a divider, generates video output signals according to the selection made between the 1-bit and the 2-bit plane video boards. The shift register shifts the inputted data according to the order of the clock pulses. In the case of the 1-bit plane video board operation, eight clock pulses are supplied with a clock pulse input line connected to the clock generator output line by the jumper, while in the case of the 2-bit plane video board operation, four clock pulses are supplied with the clock pulse input line coupled to the divider by the jumper. The frequency of the clock pulses from the clock generator is divided by 2 through passing the divider. The decision of the operations of each bit plane video board is made by the jumper.

22 Claims, 4 Drawing Sheets

VIDEO BOARD FOR SERVING BOTH 1-BIT PLANE OPERATION AND 2-BIT PLANE OPERATION

BACKGROUND OF THE INVENTION

The present invention relates to video boards for use in, for example, personal computers, and more particularly to video boards supporting both a 1-bit plane video board mode for a black/white monitor and a 2-bit plane video board mode for a 4-gray level monitor.

Heretofore, a known monochrome video board has supported a 2-gray level (black and white) monochrome monitor. Recently, however, an improved monochrome video board has been developed to support a 4-gray level(black, white, gray1 and gray2) monochrome monitor for graphics.

The former 2-gray level monochrome monitor usually must use the 1-bit plane board for supplying two kinds of video intensity (black and white) and the latter 4-gray level monochrome monitor must use the 2-bit plane video board for supplying four kinds of video intensity (black, white, gray1 and gray2). Conventionally, the two video boards have different hardware. That is, since the 2-gray level monochrome monitor and the 4-gray level monochrome monitor each utilizes its own bit plane operation, they have not been compatible with each other. Therefore, the 1-bit plane video board can never support the 4-gray level monitor, and if the 2-bit plane video board is connected to the black/white monitor, it may have considerable disadvantages not only in memory allocation and race problems but also in cost.

SUMMARY OF THE INVENTION

Thus, an object of the present invention is to provide a video board capable of being applied to different types of monochrome monitors by operating selectively the 1-bit plane video board mode or 2-bit plane video board mode.

According to one aspect of the present invention, a video board serving both the operation of the 1-bit plane video board and the operation of the 2-bit plane board includes a graphic processor for controlling operation of the video board under the control of a computer, a memory for storing and sending out picture information under the control of the graphic processor, a switch for the picture information in the memory by separately buffering it into the most and the least significant bits, a video output controller for selectively generating both operation of the 1-bit plane video board and the 2-bit plane video board by shifting the output of the switch and by a given shift order depending on the selection between the operation of the 1-bit and the 2-bit plane video board, and a connector for transmitting output of the video output controller to a monitor.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

Figure 1:
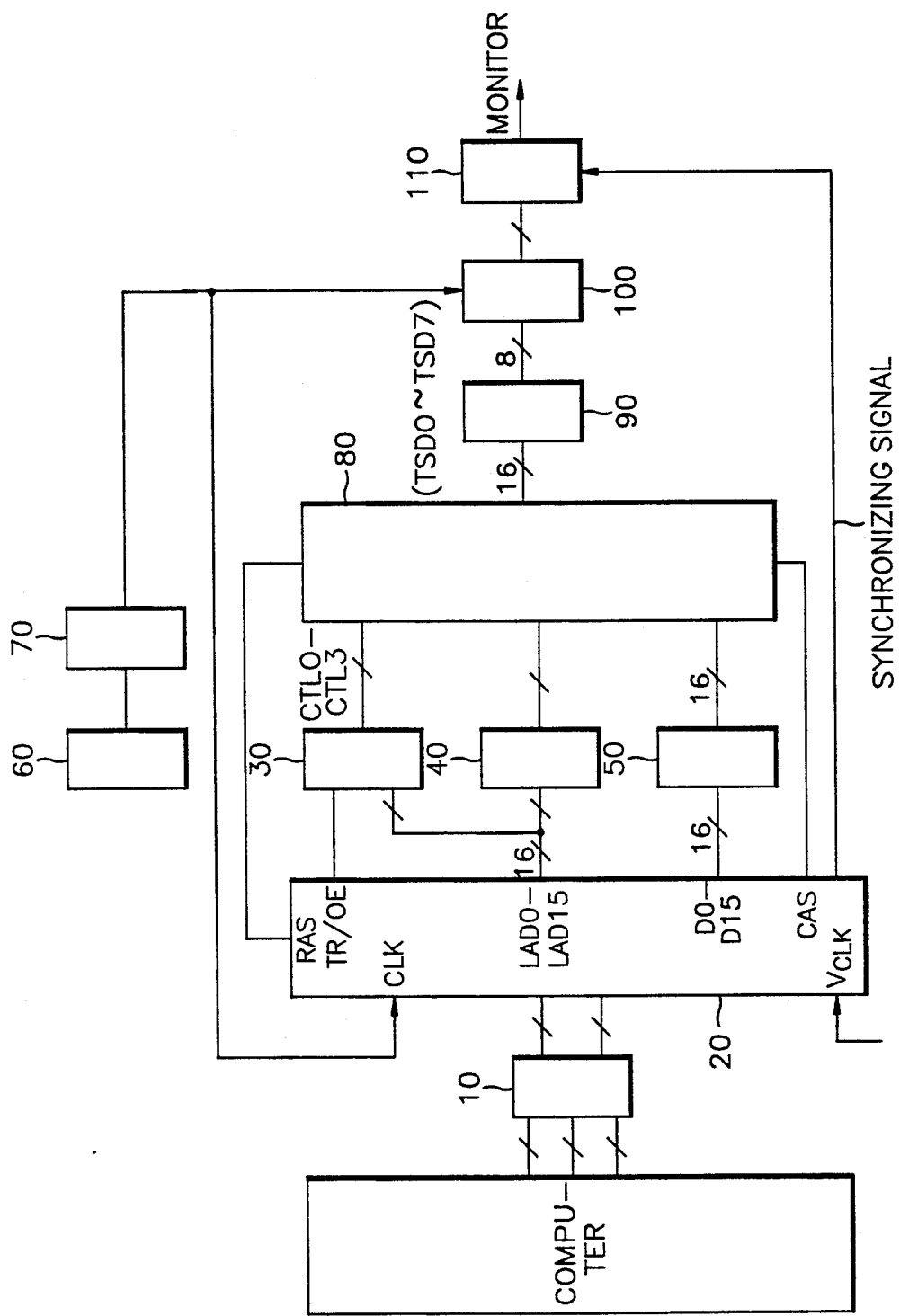
FIG. 1 is a block diagram of the present invention.

In FIG. 1, a block diagram according to the invention is shown. A graphic processor 20 controls the general operation of a video board according to the invention. A host interface 10 exchanges data and control signals between a personal computer and the graphic processor 20. A memory controller 30 is connected to the graphic processor 20 for generating and applying write control signals or read control signals to a memory 80, which stores the information from the personal computer. Using a decoded addressing technique, an address decoder 40, connected to the address lines of the graphic processor 20, selects specified addresses within the memory 80. A data buffer 50 transmits information from the graphic processor 20 to the memory location selected by the address decoder 40. A switch 90 buffers the 16-bit data from the memory 80 and outputs the 16-bit data into a video output controller 100 only eight bits at a time, while the video output controller 100 shifts the 8-bit data from the switch 90 according to the selection made between 1-bit plane video board mode and 2-bit plane video board mode, or transmits in parallel the input data. The video output controller 100 and a monitor are interconnected by a connector 110. A timing controller 70, supplied by an oscillator 60, generates adequate clock pulses to the graphic processor 20 and the video output controller 100 by dividing the clock frequency.

Figure 2:
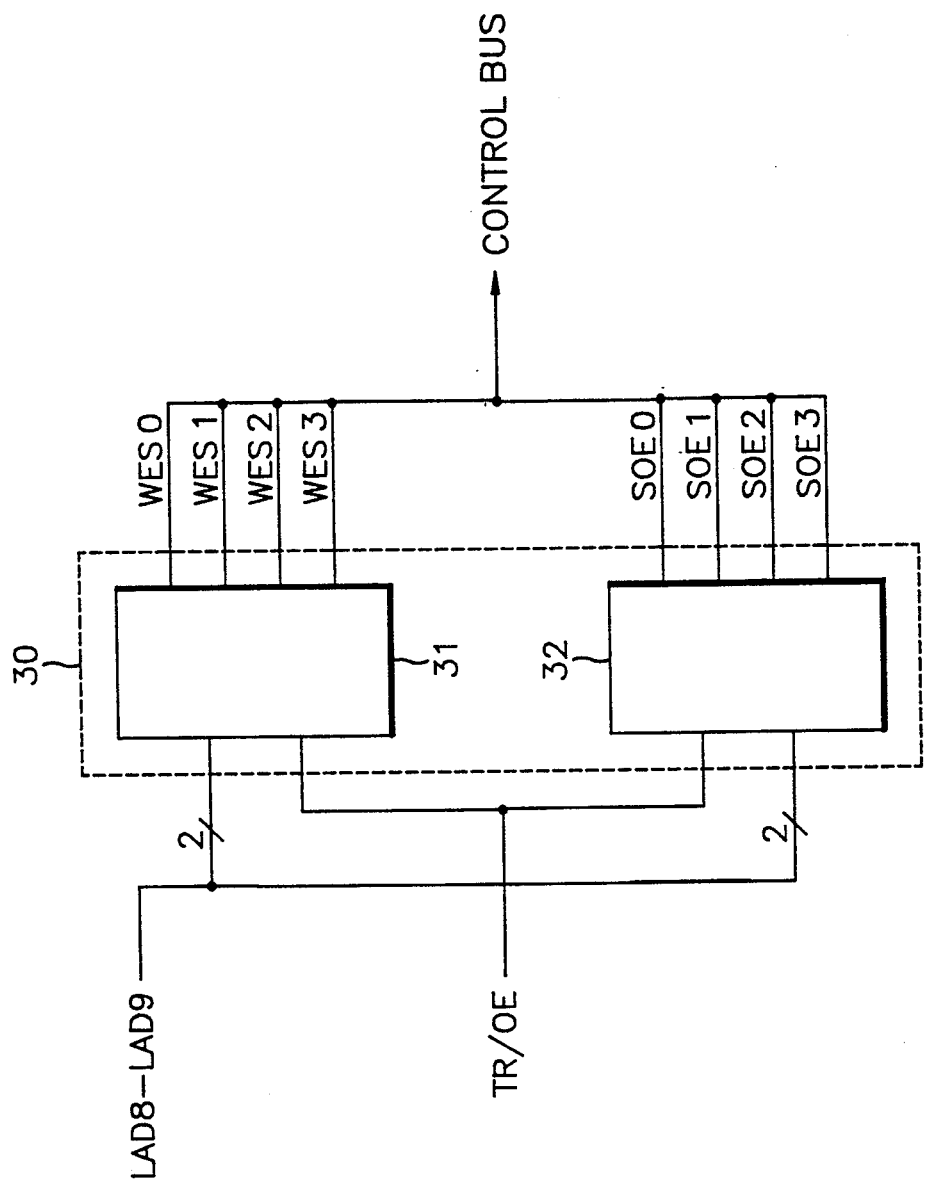
FIG. 2 is a circuit diagram of the memory controller in FIG. 1.

FIG. 2 shows in more detail an example of the memory controller 30 in FIG. 1, in which the first memory controller 31 for generating write enable signals to the memory 80 and a second memory controller 32 for generating serial output enable signals to the memory 80 are both controlled by two address lines LAD8–LAD9 and a transmission or output enable line TR/OE.

Figure 3:
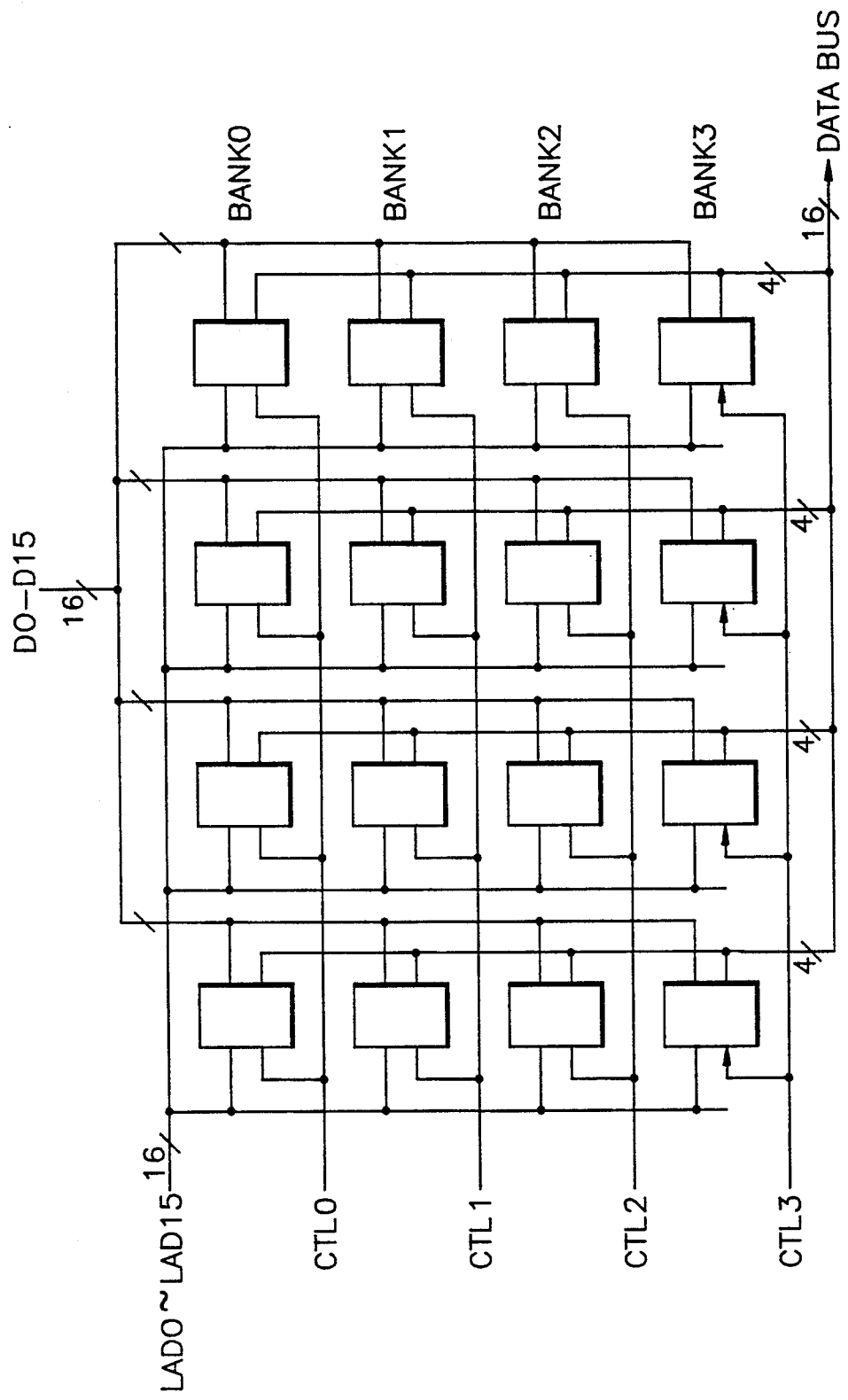
FIG. 3 is a circuit diagram of the memory in FIG. 1.

A more detailed block diagram of an example of the memory 80 is shown in FIG. 3. The memory 80, composed of sixteen 16K ×4 DRAMs 82, is divided into quarters, and each part, composed of four RAMs, is called a bank. Each bank is selected by the control signals from the memory controller 30.

Figure 4:
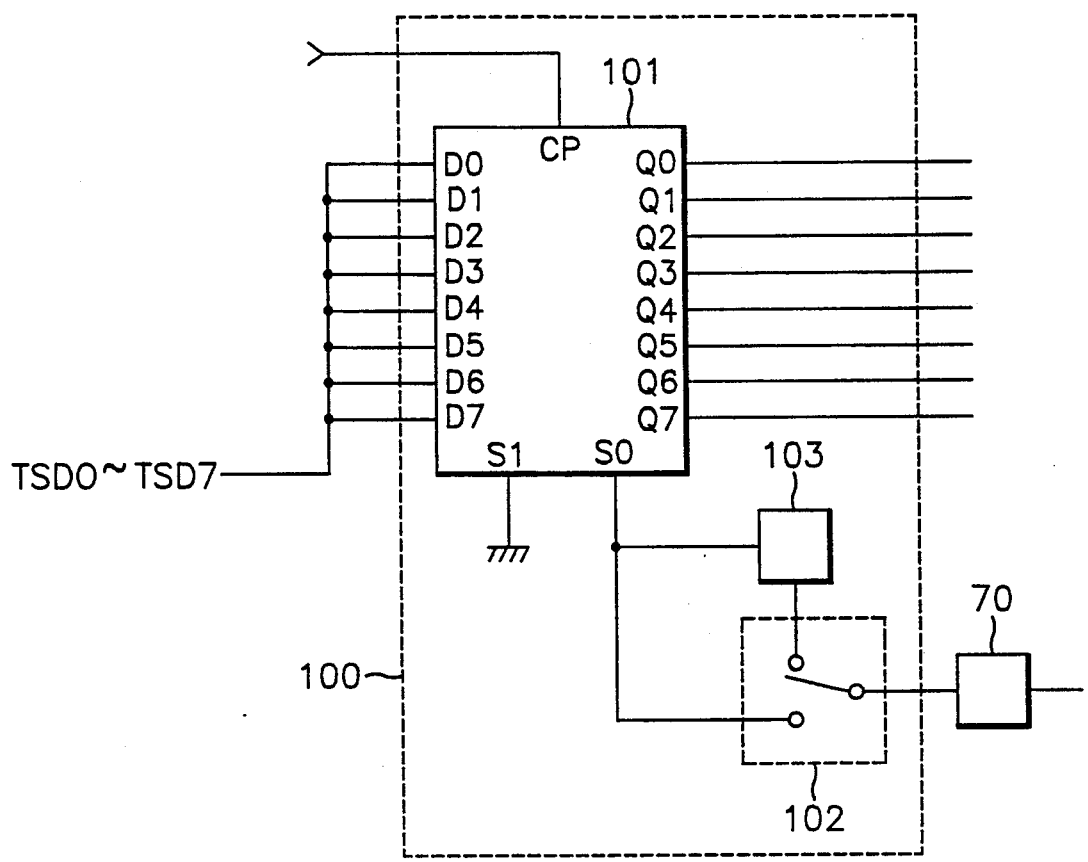
FIG. 4 is a circuit diagram of the video output controller in FIG. 1.

Referring to FIG. 4, a more detailed block diagram of the video output controller 100 in FIG. 1 is shown. A shift register 101 shifts the data from the switch 90 by a required shift order, according to the condition of first and second selection lines S0, S1 or outputs in parallel the same data that is input. With a jumper 102, the user selects 1-bit plane video board or 2-bit plane video board. Operation of the 2-bit plane video board is performed by a divider 103 for dividing the period of the timing controller 70.

The graphic processor 20 exchanges data, addresses and control signals with a computer via the host interface 10. The graphic processor 20 controls the video board and sends pictures to the monitor in accordance with the information from the personal computer, and tells the personal computer when the execution of a given instruction is accomplished.

The graphic processor 20 is supplied with clock (CLK) by the clock generator 70, and from this a video synchronizing signal is generated. For example, VCLK input line of "TMS 34010" of the Texas Instrument Co. is supplied with 13.3 MHz-clock when the machine cycle of the graphic processor 20 is 40 MHz.

The graphic processor 20 may generate a horizontal synchronous signal (H-SYNC) of 65 KHz and a vertical synchronous signal (V-SYNC) of 62 KHz by dividing the frequency of the input clock (V CLOCK) as necessary; otherwise the frequencies of these two synchronous signals (H/V-SYNC) can be adjusted by programming when using "TMS 34010".

In addition to generating those synchronous signals, the graphic processor 20 generates address signals, transmission or output enable (TR/OE) signal, row address strobe signal (RAS) and column address strobe (CAS) signal in order to refresh Dynamic Random Access Memory (DRAM) 80, which includes video RAM(VRAM) for the monitor and general purpose RAM (RAM) for the other than the monitor.

The TR/OE signal and address signals for controlling writing or reading of the memory 80 content is applied to the memory controller 30, which generates four memory control signals to pins CTL 0 to CTL 3, as illustrated in FIG. 2.

The first controller 31 generates write enable signals to pins WES0 to WES3 for storing information in the memory 80 under the control of the address signals from lines LAD8 to LAD9 and the TR/OE signal. The second controller 32 generates serial output enable signals to pins SOE0 to SOE3 for outputting the stored information under the control of the address signals from lines LAD8 to LAD9 and the TR/OE signal.

In FIG. 3, control signals CTL0-CTL3 are equivalent to WES signals during writing phase and are equivalent to SOE signals during reading phase.

An address of the DRAMs is not designated until the RAS signal and CAS signal are active. The content being addressed is then loaded on the data bus.

The circuit of FIG. 3 uses sixteen DRAMs of 16K×4 bits, which, as mentioned above, are divided into quarters. And a batch of four DRAMs is called a bank, as illustrated in FIG. 3. Each bank is selected by one of the control signals on pins CTL0 to CTL3 which the memory controller 30 generates by the help from the two address lines of the graphic processor 20. When one of the banks is selected, 16-bit data of the selected VRAM is read out at a time.

Memory logic states of each bank selection are illustrated in Table 1;

(TABLE 1)

|  | A9 | A8 |
|---|---|---|
| The first bank of RAM | 0 | 0 |
| The second bank of RAM | 0 | 1 |
| The third bank of RAM | 1 | 0 |
| The fourth bank of RAM | 1 | 1 |

According to the logic state of the TR/OE signal of the graphic processor 20, one of the control signals, generated by the memory controller 30 applies to the corresponding bank, and the memory content of a given location can thereby be read out or written in on the basis of the address condition shown in Table 1.

The first memory controller 31 generates the write enable signals to pins WES0 to WES3, and the second memory controller 32 generates the serial output enable signals to pins SOE0 to SOE3 according to the condition of the TR/OE signal.

Thus, image data is written to a given location of the video RAM, while the TR/OE signal is in logic high state. The data in the memory location of the video RAM is transmitted to the shift register 101, while the TR/OE signal is in logic low state. The serial output enable signals enable the data to be serially loaded in the video output data bus.

Here, most areas of the video RAMs are used as a frame buffer for the video output. The rest, if any, can be used for general memory. As the frame buffer has the information relating to the screen, the graphic processor 20 always refreshes the frame buffer at regular intervals. When some data are changed, the last data can be updated within a short period owing to the characteristics by which the video RAM immediately sends the data to the shift register.

The DRAM can also be used as a memory for programs and data or used as an off-screen memory. Here, the off-screen memory, like bit block transfer, may be necessary for particular graphic operations requiring bit manipulation. The DRAM may store data of temporary results from some mathematical operation, and final data may be sent to the frame buffer of the video RAM. The 16-bit data from the frame buffer is loaded on the 8-bit data bus by the switch 90 only 8 bits at a time.

The "74LS157" device may be used for the switch 90. The 8-bit data bus is connected to the 8-bit shift register 101 of video output controller 100, as illustrated in FIG. 4.

Now the operation of video output signals is further explained. The first selection line S0 and the second selection line S1 decide the operation mode of the shift register 101.

When the second selection signal on line S1 is fixed in logic low state and the first selection signal on line S0 is in logic low state, the data into the eight input lines D0–D7 are transmitted via the eight output lines Q0–Q7 since the 8-bit shift register 101 is then set in parallel mode.

On the other hand, when the first selection line S0 is in logic high state as well as the second selection line S1 is in logic low state, the input data are shifted left as many times as required, depending on the order of the clock pulse CP.

| After one clock | Q0 | Q1 | Q2 | Q3 | Q4 | Q5 | Q6 | Q7 |
|---|---|---|---|---|---|---|---|---|
| pulse is applied | Q1 | Q2 | Q3 | Q4 | Q5 | Q6 | Q7 | X |

Figure 5A:
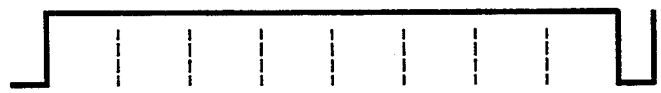
FIG. 5A is a waveform diagram of signal into the first selection line in case of 1-bit plane video board.

In the first case of 1-bit plane video board mode, the user switches the jumper 102 to the first selection line S0 directly without passing through the divider 103, so the shift register carries out a shift operation eight times between set pulses, as illustrated in FIG. 5A.

Therefore, after eight clock pulses, 8 bits of the data are transmitted in serial one bit per clock pulse to the connector 110 through the first output line Q0, and the fifth output terminal Q4 remains inactive.

After the eight clock pulses, a set pulse is applied to the first selection line S0, to set the new data received at the input terminals D0–D7 onto the output terminals Q0–Q7 respectively. Thereafter, the new data is transmitted via terminal Q0 during the next eight clock pulses CP.

Figure 5B:
FIG. 5B is a waveform diagram of signal into the first selection line in case of 2-bit plane video board.

In the second case of 2-bit plane video board mode, the jumper 102 is switched to the divider 103 so that the shift register 101 may carry out shift operation four times between set pulses, as illustrated in FIG. 5B, after 8-bit data is loaded in parallel on the eight input lines D0–D7 of the shift register 101. As a result, after four clock pulses, 8 bits of the data are transmitted in serial two bits per clock pulse to the connector 110 through the first and fifth output lines Q0, Q4.

Thus, the divider 103 increases the frequency of the set pulses from the clock generator 70 by two, in case of 2-bit plane video board mode. The logic state of the first selection line S0 should be negligibly low as compared with its logic high state when switching is carried out by means of the jumper 102.

The negligibly logic low condition referred to herein means that the value of logic low condition must be less than 1/10 of that of the logic high condition. It also means that load time should be less than 1/10 of shift time. This is because the shift register performs its operation after 8-bit data is once loaded, and the load operation must be accomplished before the next period. It is also because a time error between the end of shift and the start of the next data load operation must be avoided.

As described hereinabove, the illustrated circuit has advantages in that it is able to use two types of monitor by supporting the operation not only of 1-bit plane video board but also of 2-bit plane video board with the same video board, and in that it reduces the required memory capacity to a half of that of the 2-bit plane video plane in case of use as 1-bit plane video board, so that the rest of the memory may be used as an off-screen memory or for other purposes, thereby promoting memory efficiency and improved graphic speed.

The invention is not restricted to the details of the foregoing embodiment. The invention extends to any novel one, or any novel combination, of the features disclosed in this specification (including any accompanying claims, abstract and drawings), or to any method or process so disclosed.

What is claimed is:

1. A video board circuit supporting a one-bit plane video board mode and a two-bit plane video bard mode in a computer, comprising:

graphic processor means for providing graphic control signals to control an operation of the video board circuit in response to computer control signals of said computer;

memory means for storing picture information in response to said graphic control signals;

switching means for outputting said picture information from said memory means by separately buffering said picture information into a high order part having a first predetermined number of high order bits and a low order part having a second predetermined number of low order bits;

video output controlling means for selectively generating video output signals for one of the one-bit plane video board mode and the two-bit plane video board mode by shifting said picture information from said switching means in dependence upon selection signals; and connector means for transmitting said video output signals corresponding to the one-bit plane video board mode and said video output signals corresponding to the two-bit plane video board mode.

2. The circuit according to claim 1, wherein said video output controlling means comprises:

a shift register for shifting said picture information, said shift register comprising a first selection terminal;

a divider for providing a first of the selection signals by dividing a period of a second of the selection signals from a clock generator by two; and means for selectively supplying one of said second of the selection signals and said first of the selection signals to said first selection terminal.

3. A video controller, comprising:

a shift register for shifting parallel input video data received at input terminals to provide serial output video data at output terminals by loading said parallel input video data in response to selection signals received at a selection terminal and shifting said serial output video data at said output terminals in response to first clock pulses received at a first clock terminal; and selection means comprising a switch for selectively providing received set pulses and frequency divided set pulses as said selection signals received by said shift register.

4. The video controller according to claim 3, wherein said input terminals receive an eight-bit byte of said parallel input video data.

5. The video controller according to claim 3, further comprising:

graphic processor means for controlling operation of a video board in dependence upon computer control signals;

memory means for storing said parallel input video data to be transferred to the input terminals in dependence upon graphic control signals from said graphic processor means; and switching means for separately buffering said parallel input video data into a high order part having a first predetermined number of high order bits and a low order part having a second predetermined number of low order bits.

6. The video controller according to claim 5, wherein the memory means comprises a plurality of dynamic random access memory cells divided into groups of four memory cells each.

7. A video board circuit having a one-bit plane video board mode and a two-bit plane video board mode, said video board circuit comprising:

processor means for controlling operation of the video board circuit in dependence upon computer control signals of a computer;

means for storing picture information in dependence upon processor control signals of said processor means;

switching means for providing switching output by separately buffering said picture information from said storing means into first and second parts each having an equal number of bits, said first part comprising high order bits and said second part comprising low order bits; and video output controlling means for selectively generating video output signals for the one-bit plane video board mode and the two-bit plane video board mode by shifting said switching output from said switching means in accordance with a selection signal corresponding to selection of one of the one-bit plane video board mode and the two-bit plane video board mode.

8. The video board circuit according to claim 7, wherein said video output controlling means comprises:

means for shifting said switching output in dependence upon a first clock signal;

dividing means for dividing a period of a second clock pulse to provide a divided pulse having an increased frequency, said divided pulse being connected to a first selection terminal of said shifting means; and jumper means for providing said second clock pulse to one of said dividing means and said first selection terminal.

9. A process for controlling a video board, comprising the steps of:

controlling storage in a memory of video information in dependence upon processor control signals of a processor stage;

transmitting said video information as eight-bit bytes from said memory to a video output controlling stage;

generating video output signals in the video output controlling stage for one of a one-bit plane video board mode and a two-bit plane video board mode by shifting said video information transmitted to said video output controlling stage in response to a selection signal; and displaying said video output signals.

10. The process of claim 9, wherein the step of generating video output signals comprises:

when the one-bit plane video board mode is selected, supplying a first clock pulse as a selection signal to a first selection terminal of a shifting stage;

when the two-bit plane video board mode is selected, generating a divided clock pulse by dividing a period of the first clock pulse, increasing a frequency of said first clock pulse, and supplying said divided clock pulse as the selection signal to the first selection terminal of the shifting stage; and shifting in the shifting stage the information from the video output controlling stage according to a second clock pulse supplied to a second clock pulse terminal of the shifting stage.

11. A video board circuit supporting a one-bit plane video board mode for generating video data and a multi-bit plane video board mode for generating gray level video data, said video board circuit comprising:

memory means for storing received video data from a host interface, and for reading out said received video data as parallel video data in response to memory control signals;

graphic processor means for controlling storage of said received video data in said memory means, and for generating said memory control signals;

switch means for receiving said parallel video data in sixteen parallel bits, for converting said parallel video data to eight parallel bits, and for providing said parallel video data of said eight parallel bits; and video output controlling means for receiving said parallel video data of said eight parallel bits, for generating one-bit plane video data by converting said parallel video data of said eight parallel bits to a single bit serial format, and for generating multi-bit plane video data by converting said parallel video data of said eight parallel bits to a multi-bit serial format.

12. A video board circuit as claimed in claim 11, wherein said video output controlling means comprises shift register means coupled to receive said parallel video data of said eight parallel bits, for shifting said parallel video data of said eight parallel bits in response to clock pulses to generate one of said one-bit plane video data and said multi-bit plane video data.

13. A video board circuit as claimed in claim 11, further comprised of said graphic processor means generating horizontal synchronizing signals and vertical synchronizing signals to be combined with said one-bit plane video data and said multi-bit plane video data.

14. A video board circuit as claimed in claim 11, further comprised said graphic processor means generating strobe signals controlling refresh of said memory means.

15. A video board circuit as claimed in claim 11, further comprising data buffering means for buffering said received video data between said memory means and said graphic processor means.

16. A video board circuit as claimed in claim 11, wherein said memory means comprises a plurality of banks having four memory chips.

17. A video board circuit as claimed in claim 11, wherein said multi-bit plane video board mode is a two-bit plane video board mode.

18. A video board circuit supporting a one-bit plane video board mode for generating video data and a multi-bit plane video board mode for generating gray level video data, said video board circuit comprising:

memory means for storing received video data from a host interface, and for reading out said received video data as parallel video data in response to memory control signals;

graphic processor means for controlling storage of said received video data in said memory means, and for generating said memory control signals; and video output controlling means for receiving said parallel video data, for generating one-bit plane video data by converting said parallel video data to a single bit serial format, and for generating multi-bit plane video data by converting said parallel video data to a multi-bit serial format, said video output controlling means comprising:

shift register means for receiving said parallel video data at a plurality of input terminals, for transferring said parallel video data to a plurality of output terminals in response to selection signals received at a selection line, and for shifting said parallel video data at said output terminals in response to clock pulses to generate one of said one-bit plane video data and said multi-bit plane video data.

19. A video board circuit as claimed in claim 18, further comprising a switch for selectively supplying received set pulses one of directly to said selection line as said selection signals in response to enablement of said one-bit plane video board mode and to said selection line via means for increasing a frequency of said set pulses in response to enablement of said multi-bit plane video board mode.

20. A video board circuit as claimed in claim 18, further comprising a connector for transmitting said one-bit plane video data and said multi-bit plane video data from said shift register means to a video monitor.

21. A video board circuit as claimed in claim 18, wherein said multi-bit plane video board mode is a two-bit plane video board mode and said video output controlling means converts said parallel video data to a two-bit serial format.

22. A video board circuit supporting a one-bit plane video board mode for generating video data and a two-bit plane video board mode for generating gray level video data, said video board circuit comprising:

memory means for storing received video data from a host interface, and for reading out said received video data as parallel video data in response to memory control signals;

graphic processor means for controlling storage of said received video data in said memory means, and for generating said memory control signals; and video output controlling means for receiving said parallel video data, for generating one-bit plane video data by converting said parallel video data to a single bit serial format, and for generating two-bit plane video data by converting said parallel video data to a two-bit serial format.

* * * * *